(12) United States Patent
Wakabayashi

(10) Patent No.: US 9,041,380 B2
(45) Date of Patent: May 26, 2015

(54) REFERENCE VOLTAGE CIRCUIT AND IMAGE-CAPTURE CIRCUIT

(71) Applicant: Sony Corporation, Tokyo (JP)

(72) Inventor: Hayato Wakabayashi, Tokyo (JP)

(73) Assignee: SONY CORPORATION (JP)

( * ) Notice: Subject to any disclaimer, the term of this patent is extended or adjusted under 35 U.S.C. 154(b) by 95 days.

(21) Appl. No.: 13/781,043

(22) Filed: Feb. 28, 2013

(65) Prior Publication Data

US 2013/0193949 A1    Aug. 1, 2013

Related U.S. Application Data

(62) Division of application No. 12/177,997, filed on Jul. 23, 2008, now abandoned.

(30) Foreign Application Priority Data

Aug. 3, 2007    (JP) ................... 2007-203533

(51) Int. Cl.
*G05F 3/16*    (2006.01)
*G05F 3/02*    (2006.01)
*H04N 5/335*    (2011.01)
*H04N 5/3745*    (2011.01)

(52) U.S. Cl.
CPC .................. *G05F 3/02* (2013.01); *H04N 5/335* (2013.01); *H04N 5/37455* (2013.01)

(58) Field of Classification Search
USPC .................. 341/136; 323/288, 311–314, 315
See application file for complete search history.

(56) References Cited

U.S. PATENT DOCUMENTS

| | | | |
|---|---|---|---|
| 4,511,234 A | 4/1985 | Andresen | |
| 5,124,632 A | 6/1992 | Greaves | |
| 5,218,364 A | 6/1993 | Kumazawa et al. | |
| 5,933,051 A | 8/1999 | Tsuchida et al. | |
| 6,137,432 A | 10/2000 | Xiao | |
| 6,459,326 B2 | 10/2002 | Descombes | |
| 6,727,486 B2 | 4/2004 | Choi | |
| 8,278,996 B2 * | 10/2012 | Miki et al. | 327/541 |
| 2002/0122129 A1 | 9/2002 | Lee | |
| 2006/0001476 A1 | 1/2006 | Yanagisawa et al. | |
| 2006/0284999 A1 | 12/2006 | Muramatsu et al. | |

FOREIGN PATENT DOCUMENTS

| | | |
|---|---|---|
| JP | 06-282338 | 10/1994 |
| JP | 09-181605 | 7/1997 |

(Continued)

OTHER PUBLICATIONS

Japanese Office Action issued Jun. 16, 2009 for JP Application No. 2007-203533.

*Primary Examiner* — Matthew Nguyen
*Assistant Examiner* — Afework Demisse
(74) *Attorney, Agent, or Firm* — Sheridan Ross P.C.

(57) ABSTRACT

A reference voltage circuit for generating a reference voltage to be referred when a pixel signal is digitally converted, includes ramp voltage generating means for generating a ramp voltage which drops from a predetermined initial voltage at a certain gradient, a transistor for forming, together with the ramp voltage generating means, a current mirror circuit, and gain change means for changing a current value of a current flowing from a predetermined power supply via the transistor to change the gradient of the ramp voltage generated by the ramp voltage generating means.

4 Claims, 11 Drawing Sheets

(56) References Cited

FOREIGN PATENT DOCUMENTS

| JP | 2002-010121 | 1/2002 |
| JP | 2002-330348 | 11/2002 |
| JP | 2003-060507 | 2/2003 |
| JP | 2004-078332 | 3/2004 |
| JP | 3710361 | 8/2005 |
| JP | 3734717 | 10/2005 |
| JP | 2005-328135 | 11/2005 |
| JP | 2006-018663 | 1/2006 |
| JP | 2006-020172 | 1/2006 |
| JP | 2007-059991 | 3/2007 |

* cited by examiner

PRIOR ART

PRIOR ART

FIG. 11
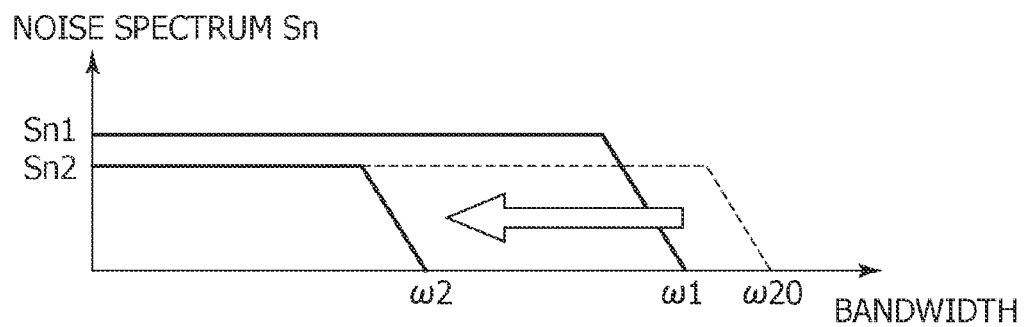
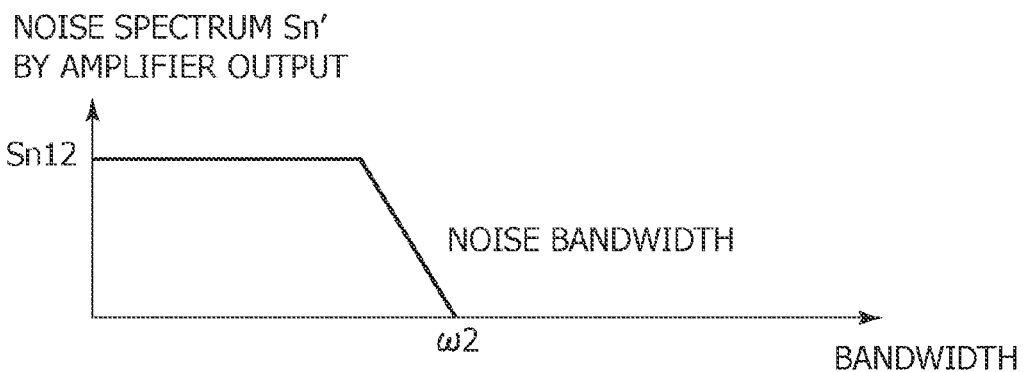

REFERENCE VOLTAGE CIRCUIT AND IMAGE-CAPTURE CIRCUIT

RELATED APPLICATION DATA

This application is a division of U.S. patent application Ser. No. 12/177,997 filed Jul. 23, 2009, the entirety of which is incorporated herein by reference to the extent permitted by law. The present application claims the benefit of priority to Japanese Patent Application No. JP 2007-203533 filed on Aug. 3, 2007 in the Japan Patent Office, the entirety of which is incorporated by reference herein to the extent permitted by law.

BACKGROUND OF THE INVENTION

1. Field of the Invention

The present invention relates to a reference voltage circuit and an image-capture circuit, and more particularly, relates to a reference voltage circuit and an image-capture circuit which are configured to enable generation of a reference signal of low noise with a low consumption current.

2. Description of the Related Art

In CMOS (Complementary Metal Oxide Semiconductor) sensors which are a solid-state image capture element, CDS (Correlated Double Sampling) circuits have been used to process an image signal.

For example, Japanese Patent No. 3734717 or No. 3710361 discloses a CMOS sensor in which a received light signal from a photodiode in a pixel is caused to pass through an analog CDS circuit arranged per each pixel column, thereby removing noise included in the image signal, and thereafter, an A/D (Analog/Digital) conversion is performed.

However, when the CDS circuit is thus used, unevenness of the CDS circuit per each pixel column causes issues that noise of a fixed pattern having a stripe-shape is generated. Further, since a capacitative element for holding a signal value after CDS processing becomes necessary, there is an issue that a circuit area increases, and since an analog signal is caused to horizontally scan at high speed by a shift register, there is an issue that the circuit is susceptible to an influence, such as switching noise.

Therefore, in Japanese Patent Application Publication No. JP-2005-328135 (Patent Document 3), for example, there is proposed a parallel-column AD conversion system (hereinafter, referred to as a column AD system, where necessary).

In the column AD system, an A/D converter is arranged per each pixel column, and an analog signal of each pixel in the selection column is read out collectively to each vertical signal line and is subjected to A/D conversion directly. Thus, the issues caused when the above-described CDS circuit is used may be solved, permitting the execution of a highly accurate noise removal.

Further, in the column AD system, a parallel process is performed per each horizontal image row, and thus, it may not be necessary to drive scanning in the horizontal direction by a high-speed frequency and it is possible to drive the A/D conversion by a low-speed frequency in a vertical direction. The system also has an advantage in that a noise component generated in a high frequency band and a signal component may be easily separated.

In the CMOS sensor in which the column AD system is adopted, a reset component corresponding to a predetermine reference potential and a data component corresponding to an amount of light received of the pixel are included in the pixel signal supplied from the pixel to the A/D converter. The A/D converter is supplied with a ramp signal (ramp voltage) which is a signal referred to when the pixel signal is subjected to A/D conversion. The ramp signal is a signal of a waveform in which voltage drops from a predetermined initial voltage at a certain gradient during a time period corresponding to the reset component of the pixel signal and in which voltage drops from a predetermined initial voltage at a certain gradient during a time period corresponding to the data component of the pixel signal.

FIG. 1 is a block diagram showing a reference voltage circuit for generating a ramp signal to be supplied to the A/D converter of the CMOS sensor.

In FIG. 1, the reference voltage circuit 11 includes a constant current source array 12, a constant current source selection unit 13, a resistance 14, and an output terminal 15.

The constant current source array 12 includes a gain-change constant current source 16, an offset-change constant current source 17, and n of ramp-waveform generation constant current sources $18_1$ to $18_n$.

The gain-change constant current source 16, the offset-change constant current source 17, and the ramp-waveform generation constant current sources $18_1$ to $18_n$ constitute a current mirror (CM). One end of the offset-change constant current source 17 and one ends of the ramp-waveform generation constant current sources $18_1$ to $18_n$ are connected to the output terminal 15. The other end of the offset-change constant current source 17 is grounded and the other ends of the ramp-waveform generation constant current sources $18_1$ to $18_n$ are connected to the constant current source selection unit 13.

The output terminal 15 is connected via the resistance 14 to a reference voltage Vref. From the reference voltage Vref, the ramp signal of voltage is generated in response to a change in current outputted from the constant current source array 12, and outputted from the output terminal 15.

When a gain of an image captured by the CMOS sensor is changed, the gain-change constant current source 16 is supplied with a control signal from a control circuit (not shown), and a current value of the gain-change constant current source 16 is changed in response to the control signal, thereby changing the gradient of the ramp signal.

The offset-change constant current source 17 is supplied with the control signal from the control circuit (not shown) when offsetting an initial voltage of the ramp signal of a time period corresponding to the reset component of the pixel signal and an initial voltage of the ramp signal of a time period corresponding to the data component of the pixel signal. The current value of the offset-change constant current source 17 is changed in response to the control signal, and the initial voltage of the ramp signal is offset.

The ramp-waveform generation constant current sources $18_1$ to $18_n$ are selected by the constant current source selection unit 13, and output a current for generating the gradient of the ramp signal.

The constant current source selection unit 13 sequentially selects the current source from which the current should flow, out of the ramp-waveform generation constant current sources $18_1$ to $18_n$, in response to a clock from the control circuit (not shown).

In the reference voltage circuit 11 configured as above, the reference voltage Vref connected to the resistance 14 is used as a reference, and the ramp signal which changes according to the current outputted from the constant current source array 12 is generated.

Thus, in addition to generating the ramp signal in which the reference voltage Vref is used as a reference, a ramp signal in which GND is used as a reference by supplying the current to the resistance connected to the output terminal and the GND, for example may be generated.

That is, FIG. 2 is a block diagram showing other example of the reference voltage circuit for generating the ramp signal.

In FIG. 2, a reference voltage circuit 11' includes a constant current generating circuit 20, three transistors 21 to 23, a gain change circuit 24, a transistor 25, a ramp generating circuit 26, an offset circuit 27, and a resistance 28.

One end of the constant current generating circuit 20 is grounded, and the other end of the constant current generating circuit 20 is connected to a drain of the transistor 21. A source of the transistor 21 is connected to a power supply voltage VDD, and a gate of the transistor 21 is connected to a gate of the transistor 22. A connection point between the gate of the transistor 21 and the gate of the transistor 22 is connected to a connection point between the constant current generating circuit 20 and the drain of the transistor 21.

A source of the transistor 22 is connected to a power supply voltage VDD, and a drain of the transistor 22 is connected to a drain of the transistor 23.

A gate of the transistor 23 is connected to the gain change circuit 24, and a connection point between the gate of the transistor 23 and the gain change circuit 24 is connected to a connection point between the drain of the transistor 22 and the drain of the transistor 23. A source of the transistor 23 is grounded.

The gain change circuit 24 is a circuit for changing the gradient of the ramp signal when the gain of the image captured by the CMOS sensor is changed. Further, the gain change circuit 24 and the transistor 23 constitute a current mirror circuit.

A drain of the transistor 25 is connected to the gain change circuit 24, a source of the transistor 25 is connected to a power supply voltage VDD, and a gate of the transistor 25 is connected to the ramp generating circuit 26. A connection point between the drain of the transistor 25 and the gain change circuit 24 is connected to a connection point between the gate of the transistor 25 and the ramp generating circuit 26.

The ramp generating circuit 26 is a circuit for generating the gradient of the ramp signal. The ramp generating circuit 26 is grounded via the resistance 28.

The offset circuit 27 is a circuit for offsetting the initial voltage of the ramp signal of a time period corresponding to the reset component of the pixel signal and the initial voltage of the ramp signal of a time period corresponding to the data component of the pixel signal. The offset circuit 27 is connected to a connection point between the ramp generating circuit 26 and the resistance 28, and this connection point is connected to an output terminal (not shown) of the ramp signal.

A description is made for voltage noise caused to the ramp signal by the constant current generating circuit 20, the transistors 21 to 23, the gain change circuit 24, the transistor 25, the ramp generating circuit 26, and the offset circuit 27, in the reference voltage circuit 11' configured as above.

Voltage noise VN0 caused by the constant current generating circuit 20 to the ramp signal is represented by the following equation (1):

$$VN0 = in0 \times (gm2/gm1) \times (gm4/gm3) \times (gm6/gm5) \times Rout \qquad (1)$$

In the equation (1), in0 denotes current noise of the constant current generating circuit 20, gm1 denotes a voltage amplification ratio of the transistor 21, gm2 denotes a voltage amplification ratio of the transistor 22, and gm3 denotes a voltage amplification ratio of the transistor 23. Further, gm4 denotes a voltage amplification ratio of the gain change circuit 24, gm5 denotes a voltage amplification ratio of the transistor 25, gm6 denotes a voltage amplification ratio of the ramp generating circuit 26, gm7 denotes a voltage amplification ratio of the offset circuit 27, and Rout denotes a resistance value of the resistance 28.

When voltage noise of the transistor 21 is represented as vn1, voltage noise VN1 caused by the transistor 21 to the ramp signal is expressed by the following equation (2):

$$VN1 = vn1 \times gm2 \times (gm4/gm3) \times (gm6/gm5) \times Rout \qquad (2)$$

When VN2 denotes voltage noise caused by the transistor 22 to the ramp signal, VN3 denotes voltage noise caused by the transistor 23 to the ramp signal, VN4 denotes voltage noise caused by the gain change circuit 24 to the ramp signal, VN5 denotes voltage noise caused by the transistor 25 to the ramp signal, VN6 denotes voltage noise caused by the ramp generating circuit 26 to the ramp signal, and VN7 denotes voltage noise caused by the offset circuit 27 to the ramp signal, total noise VN caused to the ramp signal is expressed by the following equation (3):

$$VN^2 = VN0^2 + VN1^2 + VN2^2 + VN3^2 + VN4^2 + VN5^2 + VN6^2 + VN7^2 \qquad (3)$$

As expressed in the equation (3), in the reference voltage circuit 11', the voltage noises VN0 to VN7 are superposed on the total noise VN generated in the ramp signal. In the reference voltage circuit 11', since there are many noise sources of the voltage noise, it is difficult to reduce the total noise VN. Further, as shown from the equations (1) to (3), when a return ratio (mirror ratio) in the current mirror circuit which is constituted of the gain change circuit 24 and the transistor 23 (for example, gm4/gm3) becomes large, the total noise VN also becomes large.

A current consumption of the reference voltage circuit 11' is a total of currents flowing in the current mirror from an initial stage to an output stage. That is, the current consumption of the reference voltage circuit 11' is totals of a current $I_0$ which flows in the constant current generating circuit 20, a current $I_1$ which flows in the transistor 23, a current $I_2$ which flows in the gain change circuit 24, and a current $I_3$ which flows in the resistance 28.

As described above, in the reference voltage circuit 11', there are many stages of current paths, and thus, it is difficult to reduce the current consumption.

SUMMARY OF THE INVENTION

As described above, in the related-art reference voltage circuit, it is difficult to reduce noise of ramp signal and a current consumption.

Accordingly, it is desirable to provide the invention in which a ramp signal of lower noise with a lower current consumption than the related-art reference voltage circuit may be outputted.

A reference voltage circuit according to a first embodiment of the present invention is a reference voltage circuit for generating a reference voltage referred when a pixel signal is digitally converted, and includes a ramp voltage generating means for generating a ramp voltage which drops from a predetermined initial voltage at a certain gradient, a transistor forming a current mirror circuit, together with the ramp voltage generating unit, and a gain change means for changing the gradient of the ramp voltage generated by the ramp voltage generating unit, by changing a current value of a current flown from a predetermined power supply via the transistor.

According to the first embodiment of the present invention, a ramp voltage which drops from a predetermined initial voltage at a certain gradient is generated by a ramp voltage generating means, and a current mirror circuit is formed by a transistor and the ramp voltage generating unit. Further, a current value of a current flowing from a predetermined power supply via the transistor is changed by the gain change means, and whereby, the gradient of the ramp voltage generated by the ramp voltage generating means is changed.

An image-capture circuit according to a second embodiment of the present invention is an image-capture circuit for capturing an image, and includes a pixel array in which a plurality of pixels for outputting a pixel signal are arranged and a reference voltage circuit for generating a reference voltage referred when the pixel signal outputted from the pixels of the pixel array is digitally converted. The pixel array and the reference voltage circuit are configured on an identical semiconductor chip, and the reference voltage circuit includes a ramp voltage generating means for generating a ramp voltage which drops from a predetermined initial voltage at a certain gradient, a transistor forming a current mirror circuit together with the ramp voltage generating unit, and a gain change means for changing the gradient of the ramp voltage generated by the ramp voltage generating unit by changing a current value of a current flowing from a predetermined power supply via the transistor.

In the second embodiment of the present invention, a reference voltage is generated by the reference voltage circuit. The reference voltage is referred when the pixel signal outputted from the pixels of the pixel array in which a plurality of pixels for outputting the pixel signal are arranged, is digitally converted. Further, the pixel array and the reference voltage circuit are configured on an identical semiconductor chip. A ramp voltage which drops from a predetermined initial voltage at a certain gradient is generated by the ramp voltage generating means of the reference voltage circuit. A current mirror circuit is formed by the transistor and the ramp voltage generating means. Further, a current value of a current flowing from a predetermined power supply via the transistor is changed by the gain change means, whereby the gradient of the ramp voltage generated by the ramp voltage generating means is changed.

According to the first and second embodiments of the present invention, it may be possible to generate a reference signal of low noise with a low current consumption.

BRIEF DESCRIPTION OF THE DRAWINGS

FIG. 11 is a diagram for illustrating a noise band; and

DETAILED DESCRIPTION OF THE EMBODIMENTS

Figure 1:
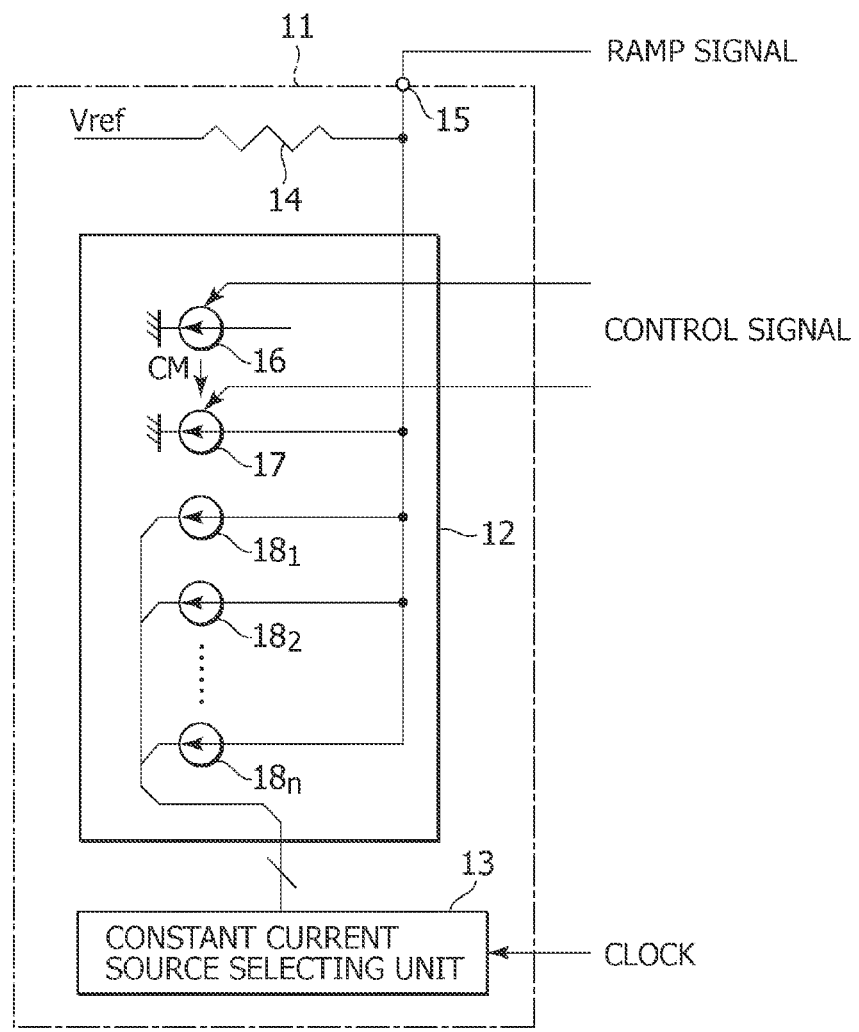
FIG. 1 is a block diagram showing a reference voltage circuit for generating a ramp signal.

Prior to describing embodiments of the present invention below, a correlation among constituent elements of the present invention and an embodiment in the specification or in the accompanying drawings is exemplified as follows: This description is made to confirm that embodiments for supporting the present invention are described in the specification or in the accompanying drawings. Accordingly, even if there is any embodiment described in the specification or in the accompanying drawings but not described here as the embodiment corresponding to the constituent elements of the present invention, it does not mean that the embodiment is not correlated with the constituent elements. Adversely, even if there is any embodiment described here as one corresponding to the constituent element, it does not mean that the embodiment is not correlated with a constituent element other than the constituent element.

A reference voltage circuit according to a first aspect of the present invention is a reference voltage circuit for generating a reference voltage to be referred when a pixel signal is digitally converted. The reference voltage circuit includes a ramp voltage generating unit (a ramp voltage generating circuit 62 in FIG. 6, for example) for generating a ramp voltage which drops from a predetermined initial voltage at a certain gradient, a transistor (a transistor 61 in FIG. 6, for example) for forming, together with the ramp voltage generating unit, a current mirror circuit, and a gain change unit (a gain change circuit 60 in FIG. 6, for example) for changing a current value of a current flowing from a predetermined power supply via the transistor in order to change the gradient of the ramp voltage generated by the ramp voltage generating unit.

In the reference voltage circuit according to the first aspect of the present invention, the gain change unit may include a variable resistance (a variable resistance 67 in FIG. 7, for example) for adjusting the current flowing via the transistor.

The gain change unit included in the reference voltage circuit according to the first aspect of the present invention is provided with a plurality of gain changing transistors (transistors 74 to 76 in FIG. 8, for example) whose drains are connected to the transistor, resistances (resistances 81 to 83 in FIG. 8, for example) each connected to sources of the gain changing transistors, and switches (switches 77 to 79 in FIG. 8, for example) each connected to gates of the gain changing transistors. The current flowing via the transistor is adjustable by switching the switches.

The gain change unit included in the reference voltage circuit according to the first aspect of the present invention, is provided with an amplifying unit (an amplifier 65 in FIG. 9, for example) for amplifying the reference voltage, and a reference voltage change unit (a reference voltage change unit 90 in FIG. 9, for example) for changing the reference voltage to be inputted to the amplifying unit. The current flowing via the transistor is adjustable in accordance with a voltage outputted by the amplifying unit.

The reference voltage change unit of the reference voltage circuit according to the first aspect of the present invention includes a plurality of resistances (resistances 91 to 95 in FIG. 9, for example) for connecting in series between a predetermined power supply and a ground level, reference voltage changing switches (switches 96 to 99 in FIG. 9, for example) for selecting respective connection points of the plurality of resistances, and a reference voltage generating amplifying unit (an amplifier 100 in FIG. 9, for example) in which an input terminal thereof is connected with the reference voltage changing switches and the reference voltage is outputted. The reference voltage changing switches is switched and the voltage to be inputted from the predetermined power supply to the reference voltage generating amplifying unit is changed, whereby the reference voltage may be changed.

The gain change unit in the reference voltage circuit according to the first aspect of the present invention may further include a capacitor (a capacitor 101 in FIG. 10, for example) for connecting an output terminal of the amplifying unit and a ground level.

In the reference voltage circuit according to the first aspect of the present invention, the ramp voltage has a section in which voltage drops from a first initial voltage at a certain gradient and a section in which voltage drops from a second initial voltage at a certain gradient, and an offset generating unit (an offset generating circuit 63 in FIG. 6, for example) for offsetting the second initial voltage with respect to the first initial voltage is further provided.

An image-capture circuit according to a second aspect of the present invention is an image-capture circuit for capturing an image, and includes a pixel array (a pixel array 34 in FIG. 3, for example) in which a plurality of pixels for outputting a pixel signal are arrayed and a reference voltage circuit (a reference voltage circuit 35 in FIG. 3, for example) for generating a reference voltage to be referred when the pixel signal outputted from the pixels of the pixel array is digitally converted. The pixel array and the reference voltage circuit are configured on an identical semiconductor chip. The reference voltage circuit includes a ramp voltage generating unit (a ramp voltage generating circuit 62 in FIG. 6, for example) for generating a ramp voltage which drops from a predetermined initial voltage at a certain gradient, a transistor (a transistor 61 in FIG. 6, for example) for forming, together with the ramp voltage generating unit, a current mirror circuit, and a gain change unit (a gain change circuit 60 in FIG. 6, for example) in which a current value of a current flowing from a predetermined power supply via the transistor is changed, whereby the gradient of the ramp voltage generated by the ramp voltage generating unit is changed.

Hereinafter, a specific embodiment to which the present invention is applied is described in detail with reference to the drawings.

Figure 3:
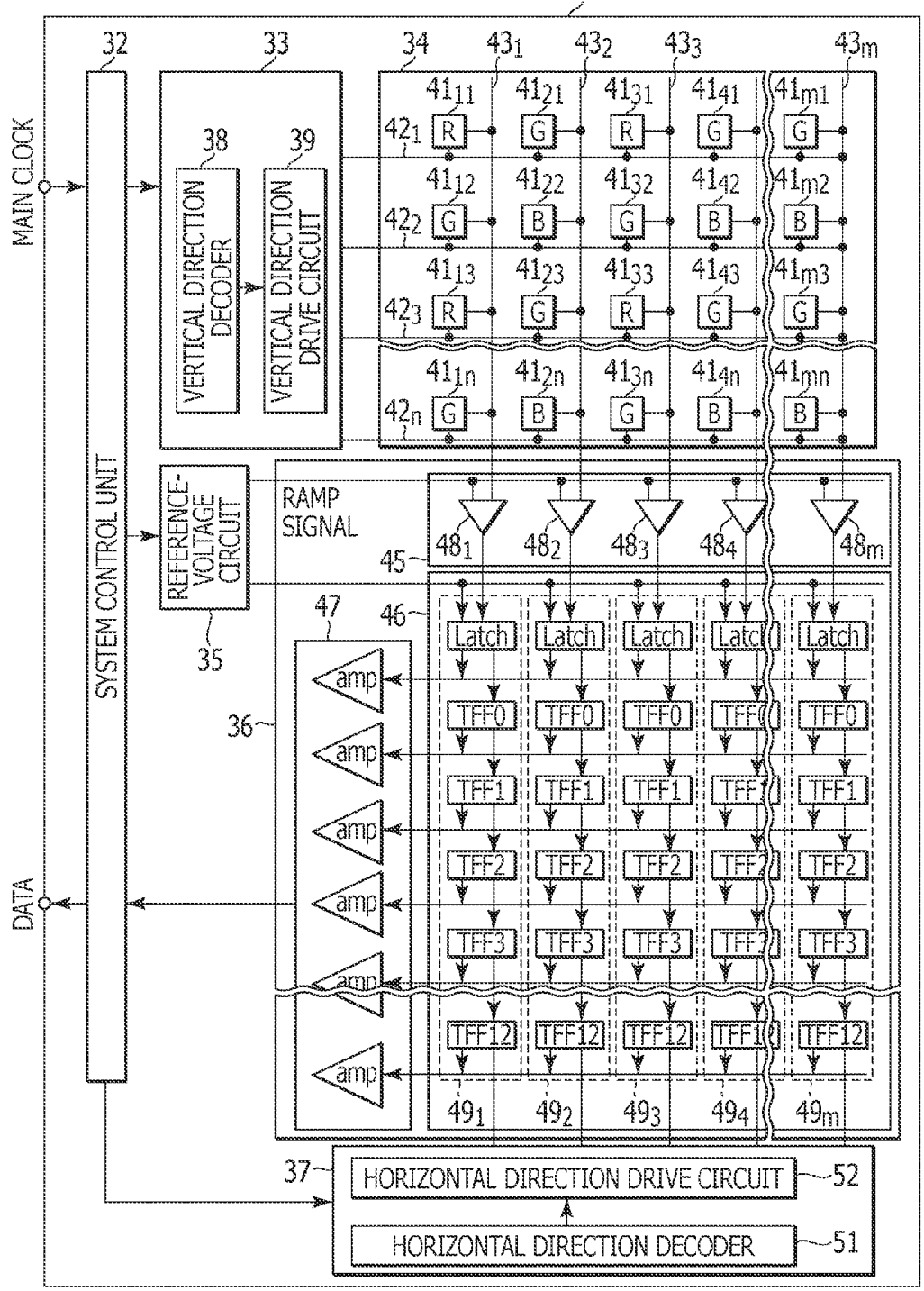
FIG. 3 is a block diagram showing a configuration example of an embodiment of a CMOS sensor to which the present invention is applied.

FIG. 3 is a block diagram showing a configuration example of one embodiment of a CMOS sensor to which the present invention is applied.

In FIG. 3, a CMOS sensor 31 is configured by a system control unit 32, a vertical scanning circuit 33, a pixel array 34, a reference voltage circuit 35, a column ADC (Analog to Digital Converter) 36, and a horizontal scanning circuit 37.

The system control unit 32 is provided with a logic control circuit, a PLL circuit (CLK division), a timing control circuit, and a communication interface, for example. The system control unit 32 is supplied with a main clock from an external circuit (not shown). The system control unit 32 controls each block configuring the CMOS sensor 31, and communicates with the external circuit.

The vertical scanning circuit 33 is provided with a vertical direction decoder 38 and a vertical direction drive circuit 39, and in accordance with a control signal from the system control unit 32, sequentially controls pixels aligned in a vertical direction of the pixel array 34 at a predetermined timing so that a pixel signal is outputted.

The vertical direction decoder 38 generates a signal for selecting a row which cause the pixel signal to be outputted and supplies the generated signal to the vertical direction drive circuit 39, when pixels in a predetermined row is thinned out from the pixels of the pixel array 34, for example, and the pixel signal is outputted from the pixels in the remaining rows.

The vertical direction drive circuit 39 generates a control signal for driving the pixels of the pixel array 34, i.e., a selection signal, a reset signal, and a trigger signal, and supplies the generated signal to the pixel array 34.

The pixel array 34 is configured by pixels $41_{11}$ to $41_{mn}$ in which the number of vertical×horizontal pixels is m×n, n of row control lines $42_1$ to $42_n$, and m of vertical signal lines $43_1$ to $43_m$. The pixels $41_{11}$ to $41_{mn}$ are connected, via the row control lines $42_1$ to $42_n$, to the vertical scanning circuit 33, and connected to the column ADC 36 via the vertical signal lines $43_1$ to $43_m$.

The pixels $41_{11}$ to $41_{mn}$ are arranged in accordance with a Bayer array, for example, such that three color lights (R, G, B) are received, and output the pixel signals to the vertical signal lines $43_1$ to $43_m$ in accordance with the control signal supplied via the row control lines $42_1$ to $42_n$ from the vertical scanning circuit 33.

A control signal for controlling a gain or an offset, a clock signal at a predetermined frequency, and the like are supplied from the system control unit 32 to the reference voltage circuit 35. The reference voltage circuit 35 generates from a predetermined initial voltage a ramp signal in which voltage drops at a certain gradient, and supplies the generated signal to the column ADC 36.

The column ADC 36 is configured by a voltage comparing unit 45, an A/D converting unit 46, and a sense amplifying unit 47.

The voltage comparing unit 45 has m of comparators $48_1$ to $48_m$. The comparators $48_1$ to $48_m$ are each supplied with the pixel signals from the pixels $41_{11}$ to $41_{mm}$ via the vertical signal lines $43_1$ to $43_m$, and are supplied with the ramp signal from the reference voltage circuit 35.

The comparators $48_1$ to $48_m$ compare the pixel signals supplied via the vertical signal lines $43_1$ to $43_m$ and the ramp signal from the reference voltage circuit 35, and supply a comparison result signal which represents the comparison result to the A/D converting unit 46.

That is, the comparator $48_1$ compares the pixel signals sequentially supplied from the pixels $41_{11}$ to $41_{1n}$ in a first column via the vertical signal line $43_1$ and the ramp signal supplied from the reference voltage circuit 35, and supplies the comparison result signal, which is obtained as a result of the comparison, to the A/D converter $49_1$ of the A/D converting unit 46. Similar to the comparator $48_1$, the comparator $48_2$ supplies a comparison result signal, which is obtained as a result of comparing the pixel signal supplied via the vertical signal line $43_2$ and the ramp signal, to the A/D converter $49_2$ of the A/D converting unit 46. Hereinafter, similarly, the comparator $48_m$ supplies a comparison result signal, which is obtained as a result of comparing the pixel signal supplied via the vertical signal line $43_m$ and the ramp signal, to the A/D converter $49_m$ of the A/D converting unit 46.

The A/D converting unit 46 has m of A/D converters $49_1$ to $49_m$. To the A/D converters $49_1$ to $49_m$, the comparison result signals are supplied from the comparators $48_1$ to $48_m$ of the voltage comparing unit 45, respectively.

The A/D converters $49_1$ to $49_m$ are each configured by a Latch and 13 TFF (Toggle Flip-Flop), and output 13-bit pixel data.

That is, to the A/D converters $49_1$ to $49_m$, the comparison result signals are supplied from the comparators $48_1$ to $48_m$, and counter clock signals of a predetermined frequency and predetermined control signals are supplied from the system control unit 32. The A/D converters 49₁ to 49ₘ count the counter clock signals supplied from the system control unit 32 in response to the comparison result signals supplied from the comparators 48₁ to 48ₘ and the control signals supplied from the system control unit 32 thereby AD-converting analog pixel signals outputted by the pixels 41₁₁ to 41ₘₙ of the pixel array 34, and outputting the resultant pixel data thus obtained.

The sense amplifying unit 47 has 13 amplifying units (amps), amplifies the pixel data outputted from the A/D converting unit 46, and outputs the pixel data via the system control unit 32 to an image processing circuit, or the like, of a latter stage.

The horizontal scanning circuit 37 is provided with a horizontal direction decoder 51 and a horizontal direction drive circuit 52, and sequentially controls a plurality of A/D converters 49₁ to 49ₘ aligned in a horizontal direction of the column ADC 36 at a predetermined timing in accordance with the control signal from the system control unit 32 such that the pixel data is outputted. When pixels in a predetermined column are thinned out and the pixel data from the pixels in the remaining columns are outputted, the horizontal direction decoder 51 generates a signal selecting the column which causes the pixel data to be outputted, and supplies the generated signal to the horizontal direction drive circuit 52. The horizontal direction drive circuit 52 generates a control signal for driving the predetermined column.

Subsequently, with reference to FIG. 4, an operation of the CMOS sensor 31 in FIG. 3 is described.

Figure 4:
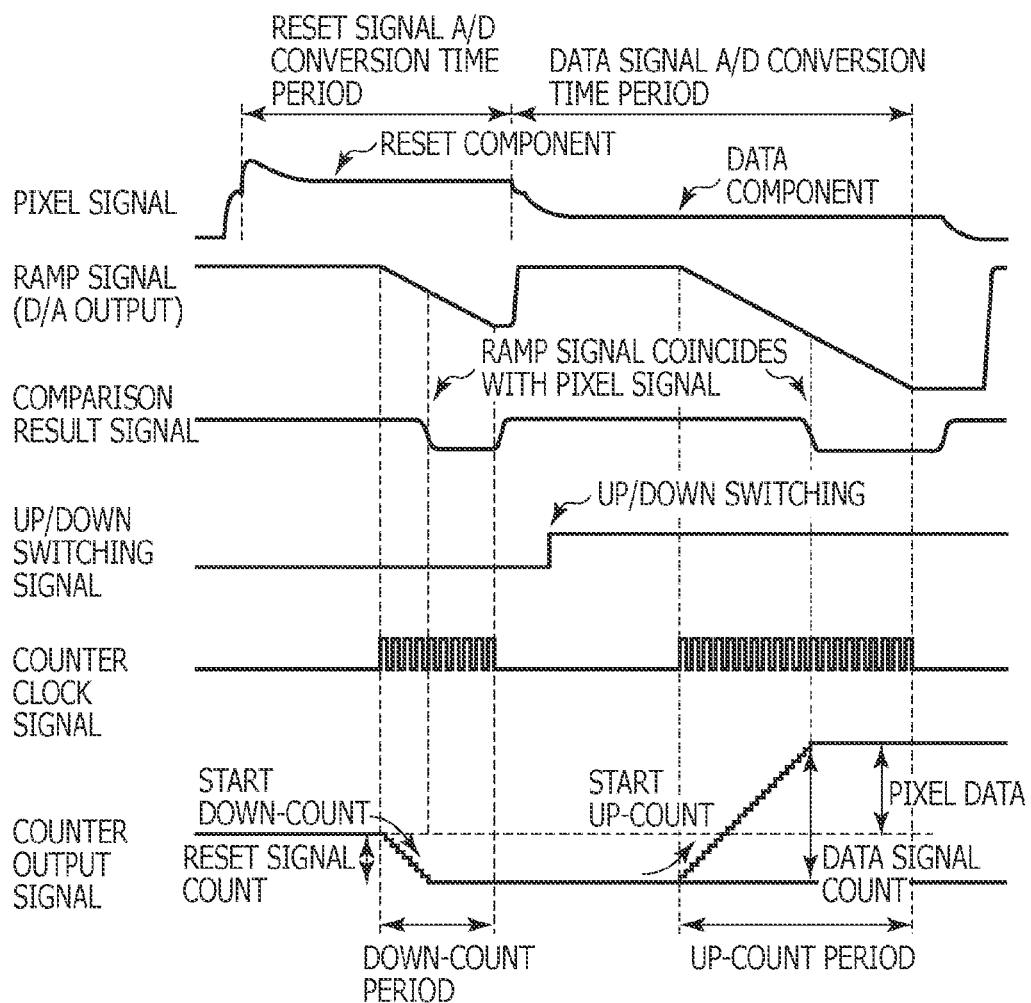
FIG. 4 is a diagram for illustrating an operation of a CMOS sensor 31.

In FIG. 4, from top, there are sequentially shown the pixel signal outputted by the pixel 41 of the pixel array 34, the ramp signal outputted by the reference voltage circuit 35, the comparison result signal outputted by the comparator 48, a signal for switching between a count-up and a count-down of the A/D converter 49, the counter clock signal outputted by the system control unit 32, and a counter output signal outputted by the A/D converter 49.

As shown at the top in FIG. 4, the pixel 41 of the pixel array 34 outputs the pixel signal (reset component) according to a predetermined reference potential during a reset signal A/D conversion time period, based on the control signal supplied from the vertical scanning circuit 33, and outputs the pixel signal (data component) based on an electric charge corresponding to an amount of light received of a photo-detector (not shown) during a data signal A/D conversion time period.

As shown at second from the top in FIG. 4, the reference voltage circuit 35 outputs the ramp signal in which voltage drops at a certain gradient from a predetermined initial voltage. In the ramp signal, a voltage-decreasing time period corresponding to the data signal A/D conversion time period is longer than a voltage-decreasing time period corresponding to the reset signal A/D conversion time period.

As shown at third from the top in FIG. 4, when the pixel signal and the ramp signal are compared, and it is found that the pixel signal is not less than the ramp signal, the comparator 48 outputs the comparison result signal of H level, and when the pixel signal is less than the ramp signal, the comparator 48 outputs the comparison result signal of L level. That is, when the voltage of the ramp signal drops at a certain gradient, the comparator 48 outputs the comparison result signal of transitions from the H level to the L level, in a case where the ramp signal and the pixel signal match.

As shown at fourth from the top in FIG. 4, a signal for switching the count-up and the count-down is supplied from the system control unit 32 to the A/D converter 49. The signal becomes L level when the voltage of the ramp signal drops at a certain gradient in the reset signal A/D conversion time period and becomes H level when the voltage of the ramp signal drops at a certain gradient during the data signal A/D conversion time period.

The system control unit 32 supplies a counter clock signal at a predetermined frequency as shown at fifth from the top in FIG. 4, for example, a high-speed counter clock signal of 500 MHz, to the A/D converter 49.

As shown at sixth from the top (bottom) in FIG. 4, the A/D converter 49 counts the counter clock signal and outputs the pixel data.

That is, when the signal for switching between the count-up and the count-down is L level, the A/D converter 49 becomes a count-down mode to start down-count at a time when the voltage of the ramp signal starts dropping in the reset signal A/D conversion time period, and holds a count value (reset signal count) which is counted until a time when the comparison result signal is changed from the H level to the L level. Thereafter, the signal for switching between the count-up and the count-down is changed from the L level to the H level, and the A/D converter 49 becomes a count-up mode to start up-count at a time when the voltage of the ramp signal starts dropping in the data signal A/D conversion period, and outputs a count value of a difference between the count value (data signal count) obtained by counting until a time when the comparison result signal is changed from the H level to the L level and the reset signal count, as the pixel data.

Thus, in the CMOS sensor 31, the pixel signal and the ramp signal are compared, and based on the comparison result, the pixel signal is subject to A/D-conversion. However, when the gain of the image captured by the CMOS sensor 31 is changed, the gradient of the ramp signal is changed. For example, during the gain-up, the gradient of the ramp signal is lowered. Further, in the CMOS sensor 31, to prevent the noise derived from a dark current which is caused by a temperature change, or the like, from affecting on the pixel data, the reference potential of the ramp signal in the data signal A/D conversion period is subject to offset with respect to the reference potential of the ramp signal in the reset signal A/D conversion period.

Figure 5:
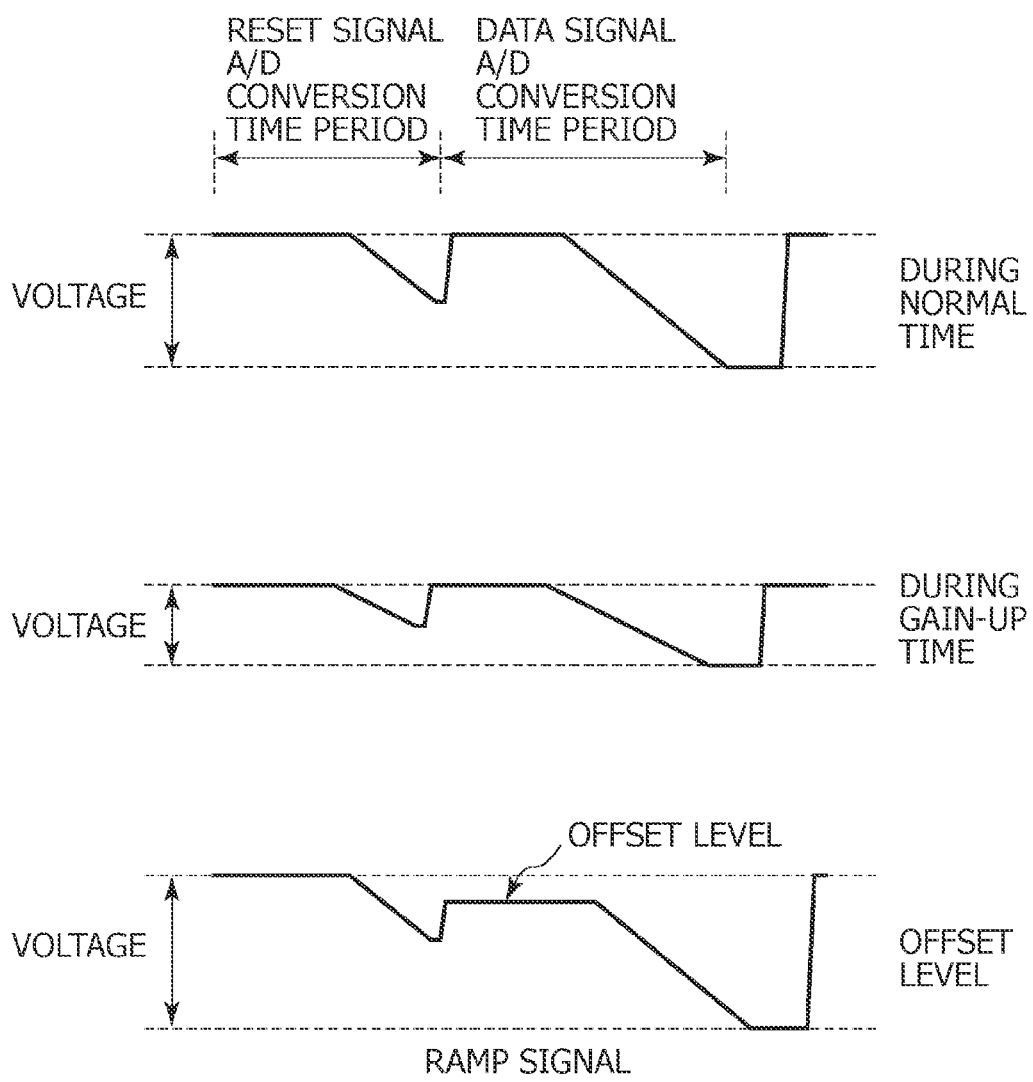
FIG. 5 is a diagram for illustrating a ramp signal at a gain-up and a ramp signal at an offset.

With reference to FIG. 5, a description is made for the ramp signal during the gain-up and the ramp signal during an offset.

The ramp signal during a normal time exhibits a waveform when the image is captured by the CMOS sensor 31 at a normal brightness. The ramp signal during the gain-up exhibits a waveform when the image is captured by the CMOS sensor 31 in a state darker than a normal state. That is, in a state darker than a normal state, an electric charge accumulated in the pixel 41 becomes small. However, when the gradient of the voltage drop of the ramp signal is made small, the time during which the comparison result signal outputted by the comparator 48 (FIG. 4) is changed from the H level to the L level may be made longer, whereby the pixel data outputted by the A/D converter 49 is gained up.

In the ramp signal in the offset, the reference voltage (voltage before the voltage drops at a constant gradient is referred to as a reference voltage) in the data signal A/D conversion period is lower than the reference voltage in the reset signal A/D conversion period by an offset level. The offset level is set according to a temperature change, or the like, and when the offset is applied, even if the dark current increases due to the temperature change, or the like, the increase is canceled.

In addition to lowering the reference voltage in the data signal A/D conversion period than the reference voltage in the reset signal A/D conversion period by the offset level, the offset may be applied in a manner the reference voltage in the reset signal A/D conversion period is higher than the reference voltage in the reset signal A/D conversion period by the offset level.

Figure 6:
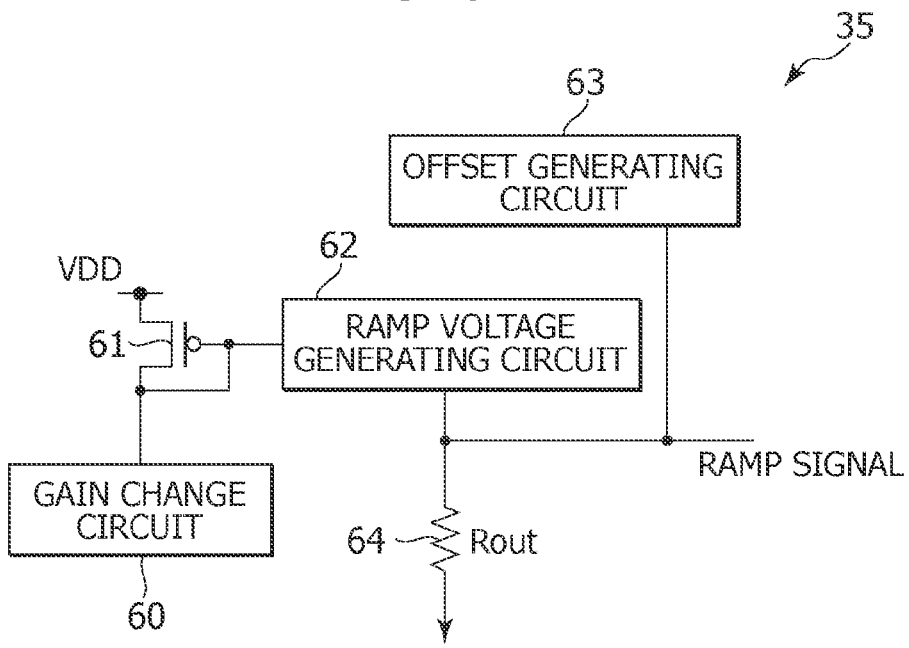
FIG. 6 is a block diagram showing a configuration example of a reference voltage circuit 35.

Subsequently, FIG. 6 is a block diagram showing a configuration example of the reference voltage circuit 35.

In FIG. 6, the reference voltage circuit 35 is configured by a gain change circuit 60, a transistor 61, a ramp voltage generating circuit 62, an offset generating circuit 63, and a resistance 64.

The gain change circuit 60 is connected to a drain of the transistor 61, and a source of the transistor 61 is connected to a power supply voltage VDD. Further, a gate of the transistor 61 is connected to the ramp voltage generating circuit 62. A connection point between the gain change circuit 60 and the drain of the transistor 61 is connected to a connection point between the gate of the transistor 61 and the ramp voltage generating circuit 62.

The ramp voltage generating circuit 62 is grounded via the resistance 64. A connection point between the ramp voltage generating circuit 62 and the resistance 64 is connected to the offset generating circuit 63. This connection point is connected to an output terminal (not shown) which outputs the ramp signal.

As described with reference to FIG. 5, the gain change circuit 60 is a circuit for changing the gradient of the ramp signal when the gain is changed. The ramp voltage generating circuit 62 is a circuit for generating the gradient of the ramp signal. As described with reference to FIG. 5, the offset generating circuit 63 is a circuit for applying offset to the reference potential of the ramp signal at an offset is applied.

Figure 7:
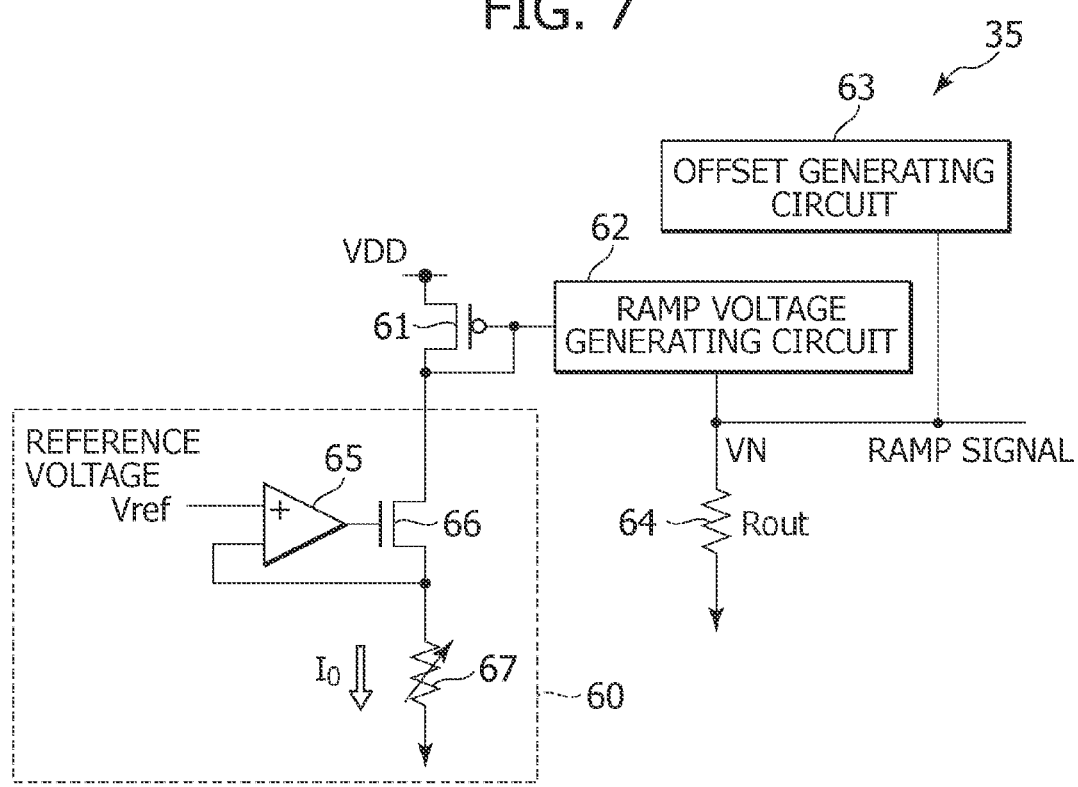
FIG. 7 is a block diagram showing a configuration example of a gain change circuit 60.

Subsequently, FIG. 7 is a block diagram showing a configuration example of the gain change circuit 60.

As shown in FIG. 7, the gain change circuit 60 is configured by an amplifier 65, a transistor 66, and a variable resistance 67.

A + input terminal of the amplifier 65 is connected to a predetermined reference voltage Vref, and an output terminal of the amplifier 65 is connected to a gate of the transistor 66. A drain of the transistor 66 is connected to the drain of the transistor 61, and a source of the transistor 66 is grounded via the variable resistance 67. A connection point between the source of the transistor 66 and the variable resistance 67 is connected to a − input terminal of the amplifier 65.

In the gain change circuit 60, by changing a resistance value of the variable resistance 67, a current value of a current $I_0$ which flows in the variable resistance 67, in other words, a current value of a current which flows from the power supply voltage VDD into the gain change circuit 60 via the transistor 61 is changed. Thus, the gradient of the ramp signal is changed.

In the reference voltage circuit 35 thus configured, current paths become smaller compared to the reference voltage circuit 11' described with reference to FIG. 2, and, the current consumption may be reduced. Further, in the reference voltage circuit 35, the noise caused in the ramp signal may also be reduced more than that in the reference voltage circuit 11'.

Herein, in the reference voltage circuit 35, total noise VN caused in the ramp signal may be expressed by the following equation (4):

$$VN^2 = VN0^2 + VN1^2 + VN2^2 + VN3^2 \quad (4)$$

Noted, in the equation (4), VN0 denotes the voltage noise caused by the gain change circuit 60 to the ramp signal, VN1 denotes the voltage noise caused by the transistor 61 to the ramp signal, VN2 denotes the voltage noise caused by the ramp voltage generating circuit 62 to the ramp signal, and VN3 denotes the voltage noise caused by the offset generating circuit 63 to the ramp signal.

Further, based on assumption that in0 denotes the current noise of the gain change circuit 60, the voltage noise VN0 applied by the gain change circuit 60 to the ramp signal is expressed by the following equation (5):

$$VN0 = in0 \times (gm2/gm1) \times Rout \quad (5)$$

Noted in the equation (5), gm1 denotes a voltage amplification ratio of the transistor 61, gm2 denotes a voltage amplification ratio of the ramp voltage generating circuit 62, and Rout denotes a resistance value of the resistance 64.

Further, base on assumption that vn1 denotes voltage noise of the transistor 61, the voltage noise VN1 applied by the transistor 61 to the ramp signal may be expressed by the following equation (6):

$$VN1 = vn1 \times gm2 \times Rout \quad (6)$$

Figure 2:
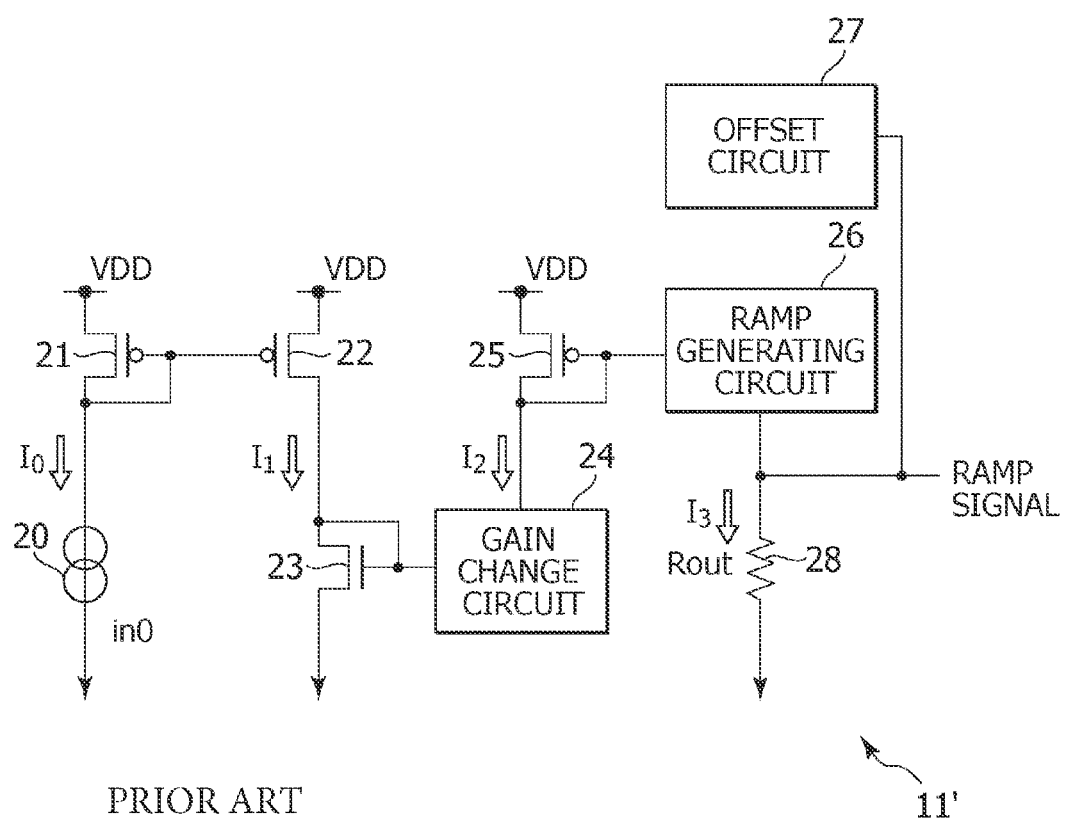
FIG. 2 is a block diagram showing another example of the reference voltage circuit for generating a ramp signal.

Herein, the current noise in0 of the gain change circuit 60 is superimposition of the noise caused by the amplifier 65, the noise caused by the transistor 66, the noise caused by the variable resistance 67, and the noise caused by the reference voltage Vref, but when compared with the reference voltage circuit 11' in FIG. 2, a noise difference between the both is just current noise inr by the variable resistance 67.

Thus, a description is given regarding a change of the voltage noise VN0 applied by the gain change circuit 60 to the ramp signal when the gain by the gain change circuit 60 becomes 1/N times, in other words, when the current value $I_0$ becomes N times, for example.

Current noise $inr^2$ caused by the variable resistance 67 is expressed by the following equation (7).

$$inr^2 = 4kT/R \quad (7)$$

In the equation (7), k denotes a Boltzmann constant, T denotes a temperature, and R denotes a resistance value of the variable resistance 67.

Herein, the resistance value R of the variable resistance 67 when the current value $I_0$ becomes N times is $Vref/(I_0 \times N)$, and thus, the current noise inr is expressed by the following equation (8):

$$inr = \sqrt{(4kT/(Vref/(I_0 \times N)))} \quad (7)$$

The voltage amplification ratio gm1 of the transistor 61 when the current value $I_0$ becomes N times is $\sqrt{(2\beta_1 I_0 \times N)}$, and the voltage amplification ratio gm2 of the ramp voltage generating circuit 62 when the current value $I_0$ becomes N times is $\sqrt{(2\beta_2 I_0 \times N)}$. Therefore, according to the equation (5), when the current value $I_0$ becomes N times, the voltage noise VN0 becomes $\sqrt{N}$ times. Herein, $\beta_1$ denotes a current amplification ratio of the transistor 61, and $\beta_2$ denotes a current amplification ratio of the ramp voltage generating circuit 62.

In contrary, in the reference voltage circuit 11' in FIG. 2, the current $I_0$ which flows in the constant current generating circuit 20 is constant, and thus, according to the above-described equation (1), to make the gain 1/N times, it is necessary to make the voltage amplification ratio gm4 of the gain change circuit 24 N times. Accordingly, the voltage noise VN0 applied by the constant current generating circuit 20 to the ramp signal becomes N times.

Therefore, when the gain becomes small (N>1), in the reference voltage circuit 35 in FIG. 6, the voltage noise VN0 becomes $\sqrt{N}$ times, and in the reference voltage circuit 11' in FIG. 2, the voltage noise VN0 becomes N times. Thus, an reference voltage circuit 35 is more capable of suppressing an increment of noise than the reference voltage circuit 11' in FIG. 2.

Further, when the gain becomes high (N<1), the reference voltage circuit 11' in FIG. 2 exhibits a noise reducing effect caused by making the following noises N times: the current noise in0 of the constant current generating circuit 20, the voltage noise vn1 of the transistor 21, the voltage noise VN2 applied by the transistor 22 to the ramp signal, and the voltage noise VN3 applied by the transistor 23 to the ramp signal. However, originally, the number of noise sources is larger than those in the reference voltage circuit 35 in FIG. 6, therefore, the noise reducing effect is limited. In contrary, in the reference voltage circuit 35 in FIG. 6, the noise is reduced to $\sqrt{N}$ times.

A change of the voltage noise VN1 applied by the transistor 61 to the ramp signal when the gain is made 1/N times is similar to change of the voltage noise VN5 applied by the transistor 25 of the reference voltage circuit 11' in FIG. 2 to the ramp signal. Further, a change of the voltage noise VN2 applied by the ramp voltage generating circuit 62 to the ramp signal when the gain is made 1/N times is similar to change of the voltage noise VN6 applied by the ramp generating circuit 26 of the reference voltage circuit 11' in FIG. 2 to the ramp signal.

Therefore, with respect to a change of the noise when the gain is made 1/N times, only the voltage noise VN0 changes, and accordingly, because the voltage noise VN0 of the reference voltage circuit 35 is suppressed more than the voltage noise VN0 of the reference voltage circuit 11', the reference voltage circuit 35 is more capable of reducing the noise than the reference voltage circuit 11'.

As described above, in the reference voltage circuit 35, the current consumption may be reduced, and also entire noise may be reduced.

In the reference voltage circuit 35, gain is changed by changing the resistance value of the variable resistance 67 in the gain change circuit 60, whereby a circuit configuration may be more simplified than a circuit configuration of the reference voltage circuit 11' in FIG. 2. Accordingly, a layout area of the circuit may be reduced.

Figure 8:
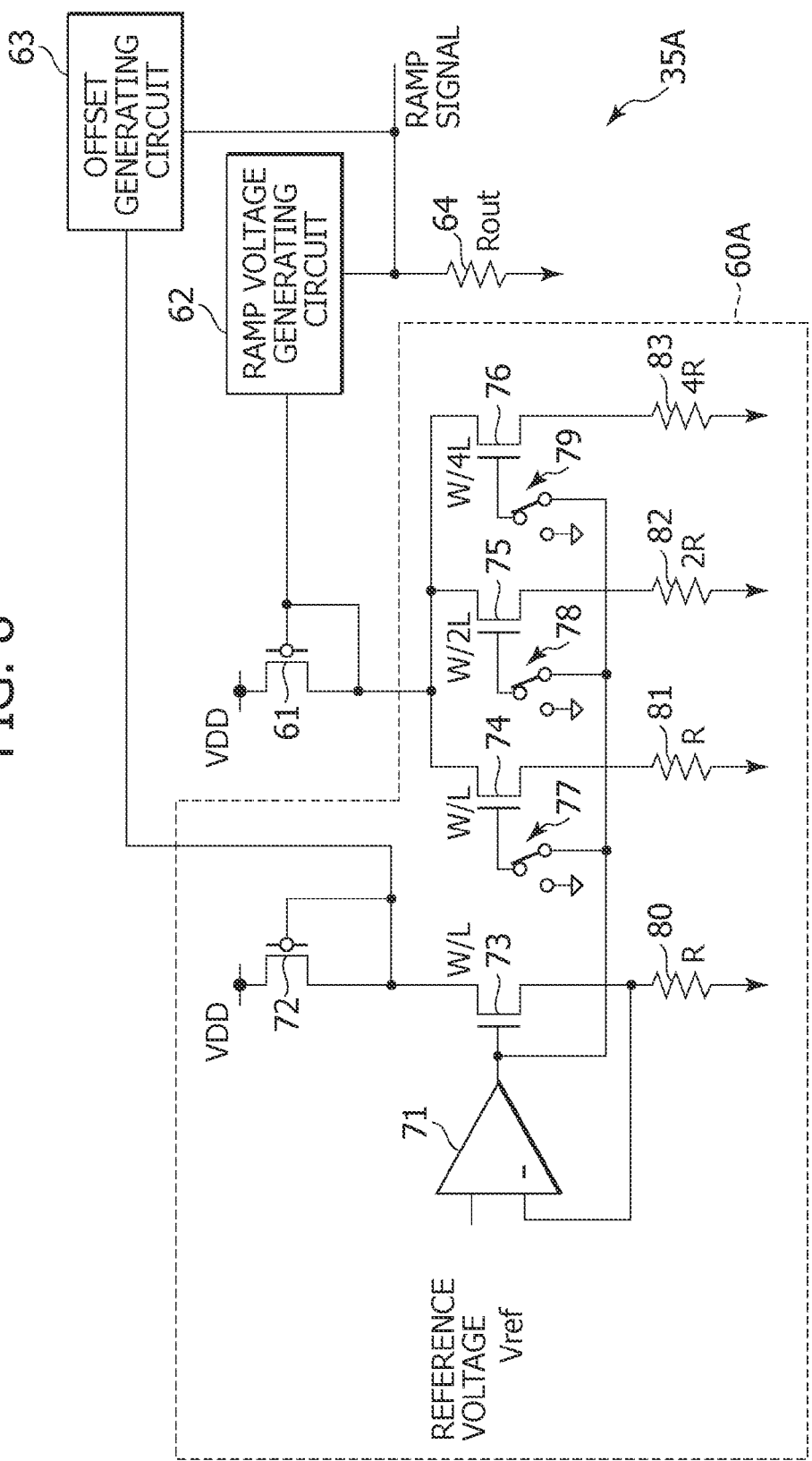
FIG. 8 is a block diagram showing another configuration example of the reference voltage circuit.

Subsequently, FIG. 8 is a block diagram showing another configuration example of the reference voltage circuit.

In FIG. 8, a reference voltage circuit 35A is configured by a gain change circuit 60A, the transistor 61, the ramp voltage generating circuit 62, the offset generating circuit 63, and the resistance 64. In FIG. 8, parts common with those in the reference voltage circuit 35 in FIG. 7 are designated by the same numerals, and the description thereof is appropriately omitted below.

That is, the reference voltage circuit 35A in FIG. 8 is same with the reference voltage circuit 35 in FIG. 7 in that the transistor 61, the ramp voltage generating circuit 62, the offset generating circuit 63, and the resistance 64 are included. However, the reference voltage circuit 35A is different from the reference voltage circuit 35 in that the gain change circuit 60A is included and the offset generating circuit 63 is connected to the gain change circuit 60A.

The gain change circuit 60A is configured by an amplifier 71, transistors 72 to 76, switches 77 to 79, and resistances 80 to 83.

A + input terminal of the amplifier 71 is connected to a predetermined reference voltage Vref, and an output terminal of the amplifier 71 is connected to a gate of the transistor 73. A source of the transistor 72 is connected to the power supply voltage VDD, a drain of the transistor 72 is connected to a drain of the transistor 73, and a gate of the transistor 72 is connected to this connection point. Also, to this connection point, the offset generating circuit 63 is connected.

A source of the transistor 73 is grounded via the resistance 80, and a connection point between the source of the transistor 73 and the resistance 80 is connected to a − input terminal of the amplifier 71.

Drains of the transistors 74 to 76 are connected to a drain of the transistor 61. A gate of the transistor 74 is connected to one end of the switch 77, a gate of the transistor 75 is connected to one end of the switch 78, and a gate of the transistor 76 is connected to one end of the switch 79. A source of the transistor 74 is grounded via the resistance 81, a source of the transistor 75 is grounded via the resistance 82, and a source of the transistor 76 is grounded via the resistance 83.

The switch 77 causes the gate of the transistor 74 to be connected to a connection point between the output terminal of the amplifier 71 and the gate of the transistor 73, or to be grounded. The switch 78 causes the gate of the transistor 75 to be connected to a connection point between the output terminal of the amplifier 71 and the gate of the transistor 73, or to be grounded. The switch 79 causes the gate of the transistor 76 to be connected to a connection point between the output terminal of the amplifier 71 and the gate of the transistor 73, or to be grounded.

Further, in the gain change circuit 60A, gate widths of the transistors 74 to 76 and resistance values of the resistances 81 to 83 are arranged to be binary-code. That is, relative to a gate width W of the transistor 73, the gate width of the transistor 74 is equally sized, the gate width of the transistor 75 is made ½ times, and the gate width of the transistor 76 is made ¼ times. Further, relative to a resistance value R of the resistance 80, the resistance value of the resistance 81 is equally sized, the resistance value of the resistance 82 is made 2 times, and the resistance value of the resistance 83 is made 4 times.

In the reference voltage circuit 35A thus configured, the offset generating circuit 63 is connected to the drain of the transistor 72, and from this connection point, a current is supplied to the offset generating circuit 63. That is, current sources may be shared between the offset generating circuit 63 and the gain change circuit 60A. Accordingly, a layout of the reference voltage circuit 35A may be made smaller than a circuit configuration in which the current sources are not shared.

In the reference voltage circuit 35A, when the switches 77 to 79 are switched, the current value of the current which flows into the gain change circuit 60A from the connection point with the transistor 61 is changed. As a result, the gain is changed. Herein, the gate widths of the transistors 74 to 76 and the resistance values of the resistances 77 to 76 are binary-coded, and thus, a circuit configuration for changing the gain may be simplified.

While the reference voltage circuit 35A in FIG. 8 is configured such that the current value is changed by the three transistors 74 to 76 and the three resistances 80 to 83, a resolution performance of the current value may be improved by using the three or more transistors and resistances.

Figure 9:
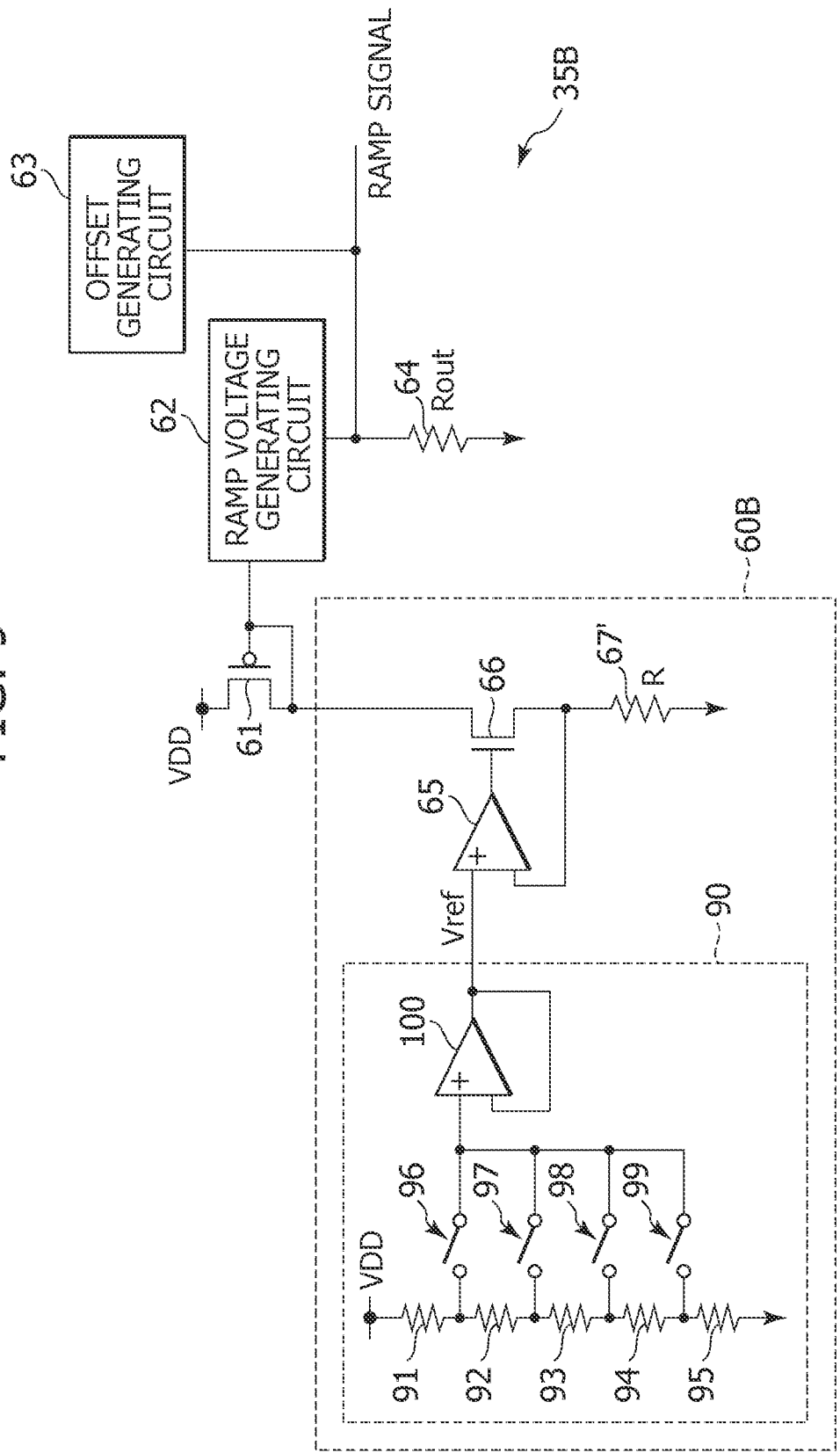
FIG. 9 is a block diagram showing still another configuration example of the reference voltage circuit.

Subsequently, FIG. 9 is a block diagram showing still another configuration example of the reference voltage circuit.

In FIG. 9, a reference voltage circuit 35B is configured by a gain change circuit 60B, the transistor 61, the ramp voltage generating circuit 62, the offset generating circuit 63, and the resistance 64. The reference voltage circuit 35B is configured by the amplifier 65, a transistor 66, a resistance 67', and a reference voltage change unit 90. In FIG. 9, parts common with those of the reference voltage circuit 35 in FIG. 7 are designated by the same numerals, and the description thereof is appropriately omitted below.

That is, the reference voltage circuit 35B in FIG. 9 is same with the reference voltage circuit 35 in FIG. 7 in that the transistor 61, the ramp voltage generating circuit 62, the offset generating circuit 63, the resistance 64, the amplifier 65, and the transistor 66 are included. However, the reference voltage circuit 35B is different from the reference voltage circuit 35 in that the resistance 67' is provided instead of the variable resistance 67 in FIG. 7, and the gain change circuit 60B has the reference voltage change unit 90.

The reference voltage change unit 90 is configured by resistances 91 to 95, switches 96 to 99, and an amplifier 100.

The resistances 91 to 95 are connected in series. One end of the resistance 91 is connected to the power supply voltage VDD, and one end of the resistance 95 is grounded. A connection point between the resistances 91 and 92 is connected to one end of the switch 96, and a connection point between the resistances 92 and 93 is connected to one end of the switch 97. A connection point between the resistances 93 and 94 is connected to one end of the switch 98, and a connection point between the resistances 94 and 95 is connected to one end of the switch 99.

The other ends of the switches 96 to 99 are connected to a + input terminal of the amplifier 100. An output terminal of the amplifier 100 is connected to a + input terminal of the amplifier 65, and the connection point is connected to a − input terminal of the amplifier 100.

In the reference voltage circuit 35B thus configured, by switching the switches 96 to 99, voltage to be supplied to the amplifier 100 is changed, and the amplifier 100 changes the reference voltage Vref to be inputted to the amplifier 65 in accordance with the voltage.

Thus, by changing the reference voltage Vref to be inputted to the amplifier 65, the voltage outputted by the amplifier 65 is changed. Then, the current flowing in the resistance 67' in accordance with the voltage, in other words, the value of current flowing into the gain change circuit 60B from the transistor 61, is changed, whereby the gain may be changed. The value of current flowing into the gain change circuit 60B changes per Vref/R. Further, the gain may be changed with high accuracy when it is so configured that the switches 96 to 99 are switched to change the reference voltage Vref.

In the gain change circuit 60B, when a band of the amplifier 65 for converting voltage into a current is narrowed, the noise may be reduced.

Figure 10:
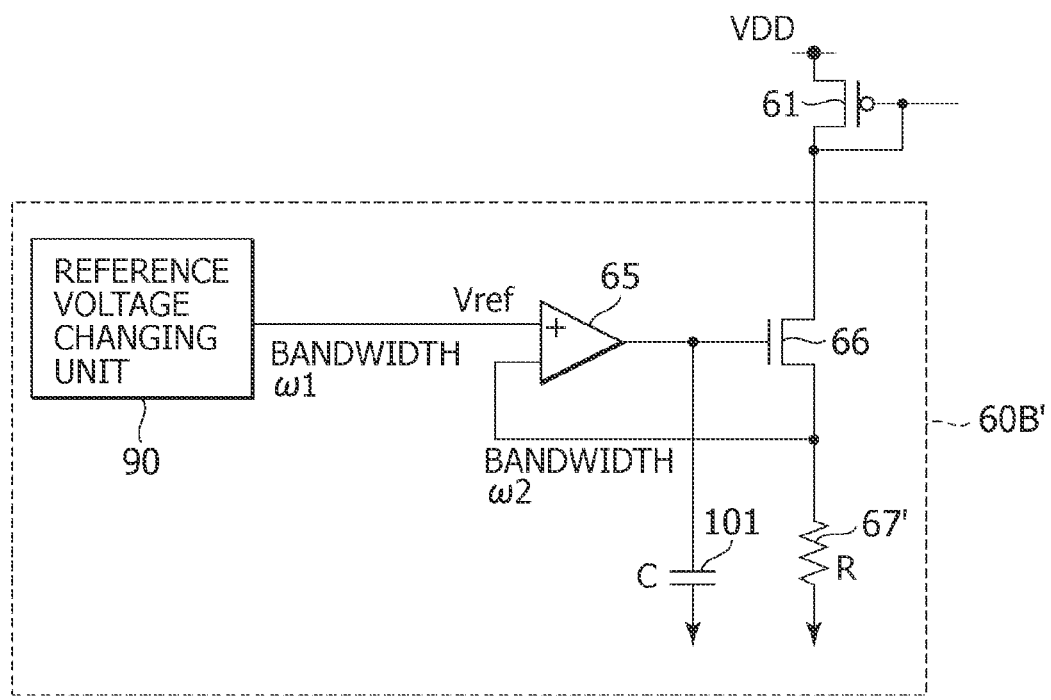
FIG. 10 is a block diagram showing another configuration example of the gain change circuit.

That is, FIG. 10 is a block diagram showing the other configuration example of the gain change circuit.

In FIG. 10, a gain change circuit 60B' is configured by the amplifier 65, the transistor 66, the resistance 67', the reference voltage change unit 90, and a capacitor 101. In FIG. 10, parts same with those in the gain change circuit 60B in FIG. 9 are designated by the same numeral, and the description thereof is appropriately omitted below.

That is, the gain change circuit 60B' in FIG. 10 is same with the gain change circuit 60B in FIG. 9 in that the amplifier 65, the transistor 66, the resistance 67', and the reference voltage change unit 90 are included. However, the gain change circuit 60B' is different from the gain change circuit 60B in that the capacitor 101 is included.

The capacitor 101 has a predetermined capacity C, and one end of the capacitor 101 is connected to a connection point between the output terminal of the amplifier 65 and the gate of transistor 66 and the other end of the capacitor is grounded.

By the provision of the capacitor 101 like this, a noise bandwidth may be narrowed and the noise caused by the amplifier 65 and the reference voltage change unit 90 may be reduced.

With reference to FIG. 11, the noise bandwidth is described.

FIG. 11 represents a relation between a noise spectrum and a bandwidth.

Sn1 denotes a noise spectrum of the reference voltage change unit 90, $\omega 1$ denotes a bandwidth of the reference voltage change unit 90 (of the amplifier 100), Sn2 denotes a noise spectrum of the amplifier 65, and $\omega 2$ denotes a bandwidth of the amplifier 65. Further, $\omega 20$ denotes a bandwidth of the amplifier 65 in a case where the capacitor 101 is not provided in the gain change circuit 60B' (i.e., the gain change circuit 60B in FIG. 9).

As shown in an upper part of FIG. 11, when the capacitor 101 is provided in the gain change circuit 60B', a high frequency component is cut, and the bandwidth $\omega 20$ of the amplifier 65 may be narrowed down to the bandwidth to the bandwidth $\omega 2$.

A value of the noise spectrum Sn' outputted from the amplifier 65 are obtained by multiplying the noise spectrum Sn1 of the reference voltage change unit 90 by the noise spectrum Sn2 of the amplifier 65. Therefore, by selecting the capacity C of the capacitor 101 such that the bandwidth $\omega 2$ of the amplifier 65 becomes equal to or less than the bandwidth $\omega 1$ of the reference voltage change unit 90, the noise spectrum Sn' outputted from the amplifier 65 may narrow the bandwidth as shown in a lower part of FIG. 11. As a result, the current noise of the current flowing in the resistance 67' may be reduced.

Figure 12:
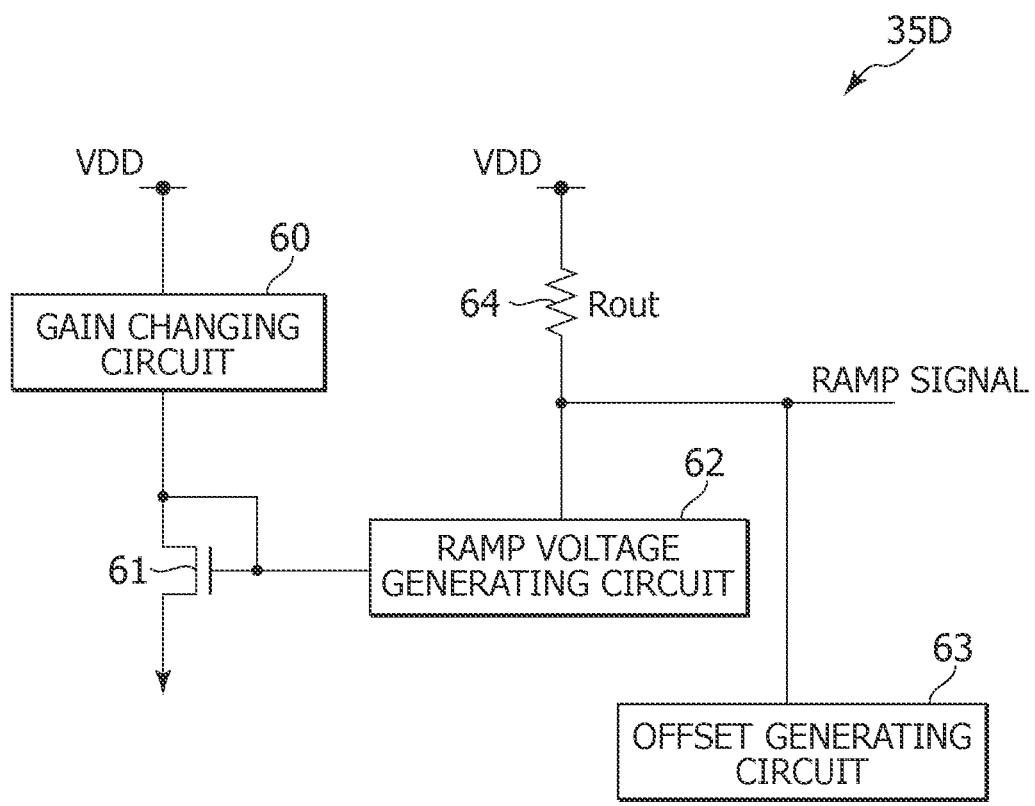
FIG. 12 is a block diagram showing yet still another configuration example of the reference voltage circuit.

Next, FIG. 12 is a block diagram showing still another configuration example of the reference voltage circuit.

As shown in FIG. 12, a reference voltage circuit 35D is configured by the gain change circuit 60, the transistor 61, the ramp voltage generating circuit 62, the offset generating circuit 63, and the resistance 64.

The reference voltage circuit 35D is configured of the block identical with those of the reference voltage circuit 35 in FIG. 6. However, while the reference voltage circuit 35 generates the ramp signal by assuming a ground level as the reference potential, the reference voltage circuit 35D generates the ramp signal by assuming the power supply voltage VDD as the reference potential.

That is, in the reference voltage circuit 35D, the drain of the transistor 61 is connected via the gain change circuit 60 to the power supply voltage VDD, and the source of the transistor 61 is grounded. The gate of the transistor 61 is connected to the ramp voltage generating circuit 62, and the connection point between the gate of the transistor 61 and the ramp voltage generating circuit 62 is connected to the connection point between the drain of the transistor 61 and the gain change circuit 60.

The ramp voltage generating circuit 62 is connected via the resistance 64 to the power supply voltage VDD. The connection point between the ramp voltage generating circuit 62 and the resistance 64 is connected to the offset generating circuit 63. The connection point is connected to an output terminal (not shown) which outputs the ramp signal.

The reference voltage circuit 35D thus configured generates the ramp signal by assuming the power supply voltage VDD as the reference potential.

That is, when the reference voltage circuit 35 in FIG. 6 is configured on a semiconductor chip such as a silicon wafer, the reference voltage circuit 35 is configured by folding back at P-channel, and the reference voltage circuit 35D is configured by folding back at N-channel.

For example, whether to select either the ground level or the power supply voltage VDD, as the reference potential for generating the ramp signal, may be determined according to the reference potential of the pixel signal subject to comparison by the ramp signal. That is, when the reference potential of the pixel signal is the ground level, the ramp signal may be generated by assuming the ground level as the reference potential. On the other hand, when the reference potential of the pixel signal is the power supply voltage VDD, the ramp signal may be generated by assuming the power supply voltage VDD as the reference potential.

In this manner, the reference potential of the pixel signal and the reference potential of the ramp signal are shared, whereby the noise caused in the image captured by the CMOS sensor 31 may be reduced.

For example, when the reference potential of the pixel signal is the ground level and the reference potential of the ramp signal is the power supply voltage VDD, in a case where the noise is caused in the power supply voltage VDD, the noise is superposed also on the result obtained by comparing the pixel signal and the ramp signal. On the other hands, in a case where the reference potential of the pixel signal and the reference potential of the ramp signal are shared at the power supply voltage VDD, even when the noise is caused in the power supply voltage VDD, the noise is cancelled in the comparison between the pixel signal and the ramp signal, and thus, the comparison result is not affected by the noise. Accordingly, the noise caused in the image may be reduced.

Further, as described above, since both folding back at the P-channel and folding back at the N-channel are selectable for the configuration of the reference voltage circuit, when 1/f noise (flicker noise) poses a problem, for example, the folding back at the P-channel in which there is little noise may be selected to reduce the influence caused by the 1/f noise.

Noted that embodiments of the present invention are not limited to the above-described embodiments and various modifications may be made insofar as they are departing from the gist of the present invention.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-203533 filed in the Japanese Patent Office on Aug. 3, 2007, the entire content of which being incorporated herein by reference.

What is claimed is:

1. A reference voltage circuit for generating a reference voltage to be referred when a pixel signal is digitally converted, comprising:
    ramp voltage generating means for generating a ramp voltage which drops from a predetermined initial voltage at a certain gradient;
    a transistor for forming, together with the ramp voltage generating means, a current mirror circuit; and
    gain change means for changing a current value of a current flowing from a predetermined power supply via the transistor to change the gradient of the ramp voltage generated by the ramp voltage generating means,
    wherein,
        the gain change means includes (a) a plurality of gain changing transistors whose drains are connected to the transistor, (b) resistances each connected to sources of the gain changing transistors, and (c) switches each connected to gates of the gain changing transistors, and
        the current flowing via the transistor is adjusted by switching the switch.

2. A reference voltage circuit for generating a reference voltage to be referred when a pixel signal is digitally converted, comprising:
    ramp voltage generating means for generating a ramp voltage which drops from a predetermined initial voltage at a certain gradient;
    a transistor for forming, together with the ramp voltage generating means, a current mirror circuit; and
    gain change means for changing a current value of a current flowing from a predetermined power supply via the transistor to change the gradient of the ramp voltage generated by the ramp voltage generating means,
    wherein,
        the gain change means includes (a) amplifying means for amplifying the reference voltage, and (b) reference voltage change means for changing the reference voltage to be inputted to the amplifying means, and
        the current flowing via the transistor according to a voltage outputted by the amplifying means is adjusted.

3. The reference voltage circuit according to claim 2, wherein:
    the reference voltage change means includes (a) a plurality of resistances for connecting in series between a predetermined power supply and a ground level, (b) reference voltage changing switches for selecting respective connection points of the plurality of resistances, and (c) reference voltage generating amplifying means, in which an input terminal is connected to the reference voltage changing switches, for outputting the reference voltage; and
    the reference voltage changing switches are switched and the voltage to be inputted from the predetermined power supply to the reference voltage generating amplifying means are changed in order to change the reference voltage.

4. The reference voltage circuit according to claim 3, wherein the gain change means further includes a capacitor for connecting an output terminal of the amplifying means and a ground level.

* * * * *